US012111363B2

(12) United States Patent
Dubuque

(10) Patent No.: US 12,111,363 B2
(45) Date of Patent: Oct. 8, 2024

(54) BATTERY STATE-OF-CHARGE PROTECTION

(71) Applicant: Aclara Technologies LLC, St. Louis, MO (US)

(72) Inventor: Mark Dubuque, St. Louis, MO (US)

(73) Assignee: Aclara Technologies LLC, St. Louis, MO (US)

(*) Notice: Subject to any disclaimer, the term of this patent is extended or adjusted under 35 U.S.C. 154(b) by 719 days.

(21) Appl. No.: 17/155,901

(22) Filed: Jan. 22, 2021

(65) Prior Publication Data

US 2021/0231740 A1 Jul. 29, 2021

Related U.S. Application Data

(60) Provisional application No. 62/965,422, filed on Jan. 24, 2020.

(51) Int. Cl.
*G01R 31/382* (2019.01)
*G01R 31/367* (2019.01)
(Continued)

(52) U.S. Cl.
CPC ......... *G01R 31/382* (2019.01); *G01R 31/367* (2019.01); *G01R 31/371* (2019.01);
(Continued)

(58) Field of Classification Search
CPC .. G01R 31/382; G01R 31/367; G01R 31/371; G01R 31/379; H02J 7/0048;
(Continued)

(56) References Cited

U.S. PATENT DOCUMENTS 10,024,579 B1 7/2018 Govar et al.
2009/0327780 A1* 12/2009 Dawkins ............... G06F 1/3268
713/323

(Continued)

FOREIGN PATENT DOCUMENTS

CN 106740189 A 5/2017
CN 107804180 A 3/2018
(Continued)

OTHER PUBLICATIONS

PCT/US2021/014625 International Search Report and Written Opinion dated Jun. 1, 2021 (21 pages).

(Continued)

*Primary Examiner* — Christopher P McAndrew
*Assistant Examiner* — Zannatul Ferdous
(74) *Attorney, Agent, or Firm* — Michael Best & Friedrich LLP

(57) ABSTRACT

Systems and methods for monitoring and/or protecting state-of-charge of one or more batteries. One method comprises determining, via a controller, location information associated with the battery. The method includes determining, via the controller, one or more battery parameters. The method includes calculating, based on the one or more battery parameters and the location information, a state of charge of the battery. The method includes controlling, via the controller and based on the state of charge, a mode of the battery.

21 Claims, 10 Drawing Sheets

(51) Int. Cl.
  *G01R 31/371* (2019.01)
  *G01R 31/379* (2019.01)
  *G06Q 10/04* (2023.01)
  *G06Q 50/06* (2024.01)
  *H02J 7/00* (2006.01)

(52) U.S. Cl.
  CPC .......... *G01R 31/379* (2019.01); *H02J 7/0048* (2020.01); *H02J 2300/24* (2020.01)

(58) Field of Classification Search
  CPC .... H02J 2300/24; H02J 7/35; H02J 13/00022; Y02E 40/70; Y02E 10/56; Y04S 10/123; G06Q 10/04; G06Q 50/06
  See application file for complete search history.

(56) References Cited

U.S. PATENT DOCUMENTS

| | | | |
|---|---|---|---|
| 2012/0057514 A1 | 3/2012 | Todd et al. | |
| 2014/0327644 A1* | 11/2014 | Mohindra | G06F 3/044 |
| | | | 345/174 |
| 2017/0000369 A1* | 1/2017 | Hyde | A61B 5/6806 |
| 2018/0026457 A1* | 1/2018 | Delevski | H02J 7/0024 |
| | | | 320/106 |
| 2018/0125425 A1* | 5/2018 | Garudadri | A61B 5/6806 |
| 2019/0033385 A1* | 1/2019 | Karner | G01R 31/374 |
| 2019/0207406 A1* | 7/2019 | Matthey | H02J 7/00309 |
| 2019/0217721 A1 | 7/2019 | Marcicki et al. | |
| 2019/0285041 A1* | 9/2019 | Chen | H02J 7/00712 |
| 2021/0341539 A1* | 11/2021 | Leonard | G06N 3/04 |

FOREIGN PATENT DOCUMENTS

| | | |
|---|---|---|
| CN | 110165692 A | 8/2019 |
| KR | 101709553 B1 | 2/2017 |
| KR | 101983986 B1 | 5/2019 |
| WO | 2018017644 A1 | 1/2018 |

OTHER PUBLICATIONS

European Search Report dated Jan. 18, 2024 for corresponding European Application No. 21745168.1.

Office Action dated Jul. 25, 2024 for corresponding Chinese Application No. 20218002274.2

* cited by examiner

BATTERY STATE-OF-CHARGE PROTECTION

RELATED APPLICATIONS

The present application claims priority to U.S. Provisional Patent Application No. 62/965,422, filed Jan. 24, 2020, the entire contents of which are hereby incorporated.

FIELD

Embodiments relate to systems and methods for monitoring and/or protecting state-of-charge of one or more batteries, and more specifically, batteries charged via one or more solar panels.

SUMMARY

Solar energy as a power source is increasing worldwide, however the growth faces difficulties depending on the climate in which solar panels are installed. Cold environments, for example, may put additional strain on batteries, including those that receive their power from solar panels. Such additional strain may result in battery failures, such as over-charging, over-cycling, and/or over-discharging. Additionally, this strain may result in a battery freezing and, therefore, a battery failure. A battery freezing point does, however, have a direct relationship with the battery state-of-charge, and may be avoided.

Additionally, weather that typically accompanies cold, such as snow and ice, can drastically decrease the efficiency of solar panels. Batteries must have enough power to provide at least a minimum required amount to continue system functionality. If solar panels fail to provide energy, and batteries have too little charge to provide to both a load and avoid freezing, large scale failures may occur. Due to these factors, it is desired for a system to plan for cold and prepare accordingly.

One embodiment provides a method for protecting a battery state-of-charge. The method includes determining, via a controller, location information associated with the battery. The method includes determining, via the controller, one or more battery parameters. The method includes calculating, based on the one or more battery parameters and the location information, a state of charge of the battery. The method includes controlling, via the controller and based on the state of charge, a mode of the battery.

In some embodiments, the method further includes reporting, via the controller, a status of the battery. In some embodiments, the status update further includes at least one selected from a group consisting of a change in state of charge, a power mode, a configuration change, and a warning notification. In some embodiments, the battery is a lead acid battery. In some embodiments, the location information includes at least one selected from a group consisting of a latitude, a longitude, an expected season, a time, a date, an ambient temperature, and a weather condition. In some embodiments, the battery parameters include at least one selected from a group consisting of a current battery voltage, a maximum battery voltage, a battery current, a maximum battery current, a temperature of the battery, and a maximum temperature of the battery. In some embodiments, the mode of the battery is one selected from a group consisting of a persist low mode and a persist full mode. In some embodiments, the method further includes determining the location of the battery has changed, and updating the location information based on the new location.

Another embodiment provides a method for protecting a battery state-of-charge. The method comprises determining, via an electronic processor and based on a location, a contextual information of the location. The method includes determining, via the electronic processor and based on the contextual information, a model indicating an expected low power schedule. The method includes receiving, via the electronic processor, a battery size, a solar panel size, and the model. The method includes determining, via the electronic processor, a state of charge threshold for the low power schedule. The method includes controlling, via the electronic processor, a power mode of the battery.

In some embodiments, the contextual information is a local weather forecasting data. In some embodiments, the method further comprises determining, based on the location and the solar panel size, an optimal tilt angle of the solar panel. In some embodiments, the method further comprises enter a low power state based on the low power schedule. In some embodiments, the method further comprises determining a power loss probability based on the model. In some embodiments, the method further comprises entering a low power state when the power loss probability passes a threshold.

Another embodiment provides a power system comprising a solar panel, a power source configured to receive energy from the solar panel, and an electronic processor coupled to the power source. The electronic processor is configured to determine, based on a climate model, an upcoming temperature below a freezing value. The electronic processor is further configured to determine a state of charge of the power source. The electronic processor is further configured to transmit a signal to the power source instructing the power source to enter a low power mode, and activate a power reserve for the duration of the freezing temperature.

In some embodiments, the climate model includes determining a winter start date based on historical temperature data. In some embodiments, the electronic processor is further configured to determine a concentration of sulfuric acid of the power source. In some embodiments, the low power mode maintains the power source at a capacity above a freezing capacity. In some embodiments, the electronic processor is further configured to determine at least one from a group consisting of a power source voltage, a power source current, and a power source temperature. In some embodiments, the electronic processor is further configured to transition the power source from a normal power mode to the low power mode. In some embodiments, the electronic processor is further configured to transition the power source from the low power mode to the normal power mode.

Other aspects of the application will become apparent by consideration of the detailed description and accompanying drawings.

DETAILED DESCRIPTION

Before any embodiments are explained in detail, it is to be understood that the embodiments are not limited in their application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more electronic processors, for example, one or more microprocessors and/or application specific integrated circuits ("ASICs"). As a consequence, it should be noted that a plurality of hardware and software based devices, as well as a plurality of different structural components, may be utilized to implement the embodiments. For example, "servers" and "computing devices" described in the specification can include one or more processing units, one or more computer-readable medium modules, one or more input/output interfaces, and various connections (e.g., a system bus) connecting the components.

Figure 1:
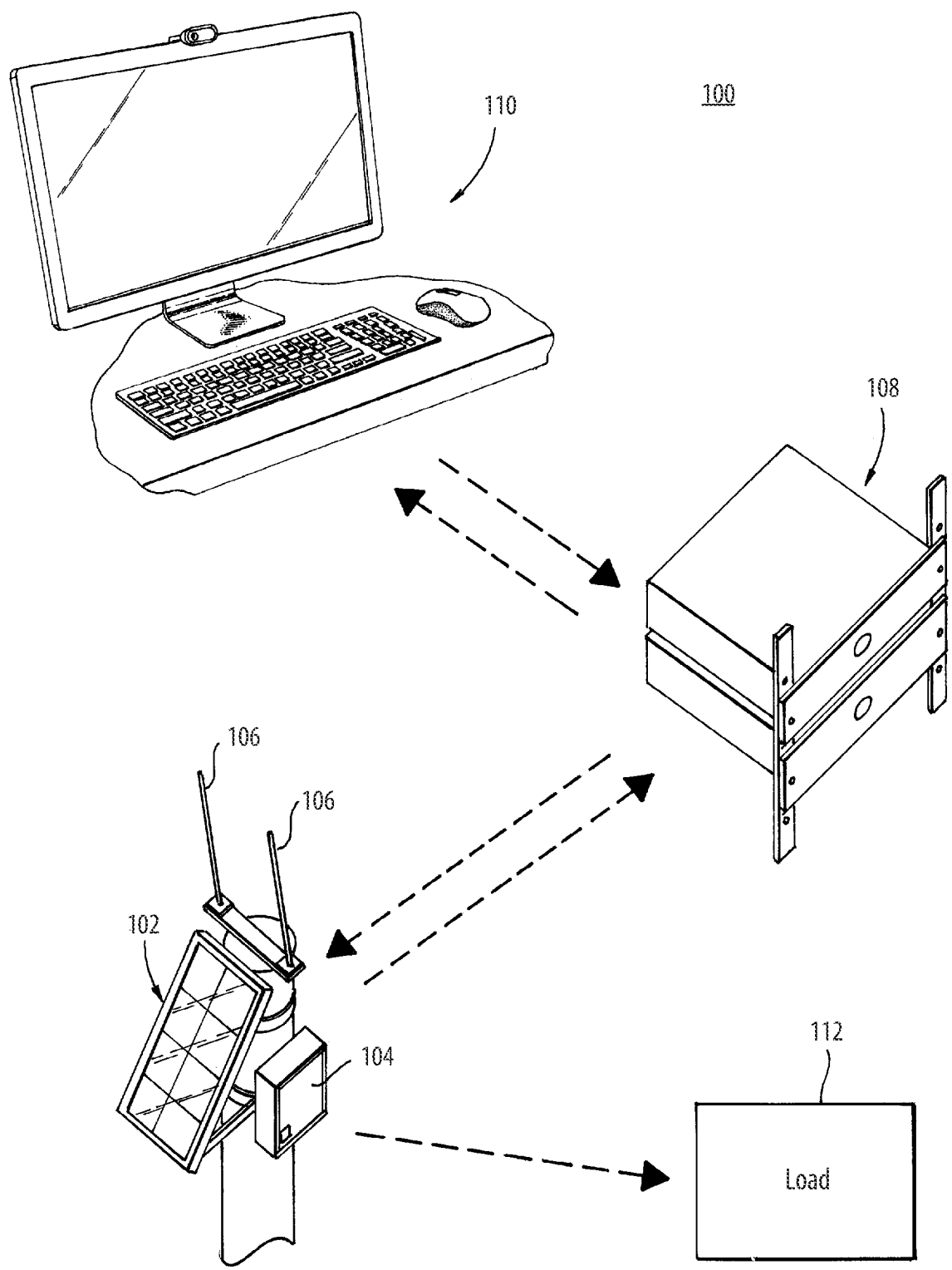
FIG. 1 illustrates an example of a solar power system, according to some embodiments.

FIG. 1 illustrates a system 100 comprising a solar panel 102, a data collection module 104, and one or more antennas 106. The one or more antennas 106 are configured to transmit information, for example, to a server 108. The server 108 is configured to transmit the information to a user device 110, such as a computer, a mobile device, or the like. The solar panel 102 converts solar energy received from sun rays to electrical energy and stores the energy in a power source (such as a battery) 200 (shown in FIG. 2). The solar panel 102 may be configured to supply power to a load 112. The load 112 may be, for example, an electrical grid. In some embodiments, the load 112 receives power from the battery 200. Energy converted and stored by the solar panel 102 is measured by the data collection module 104. The solar panel 102 may also store energy in additional power sources/batteries (not shown) or in an electrical power grid system.

Figure 2:
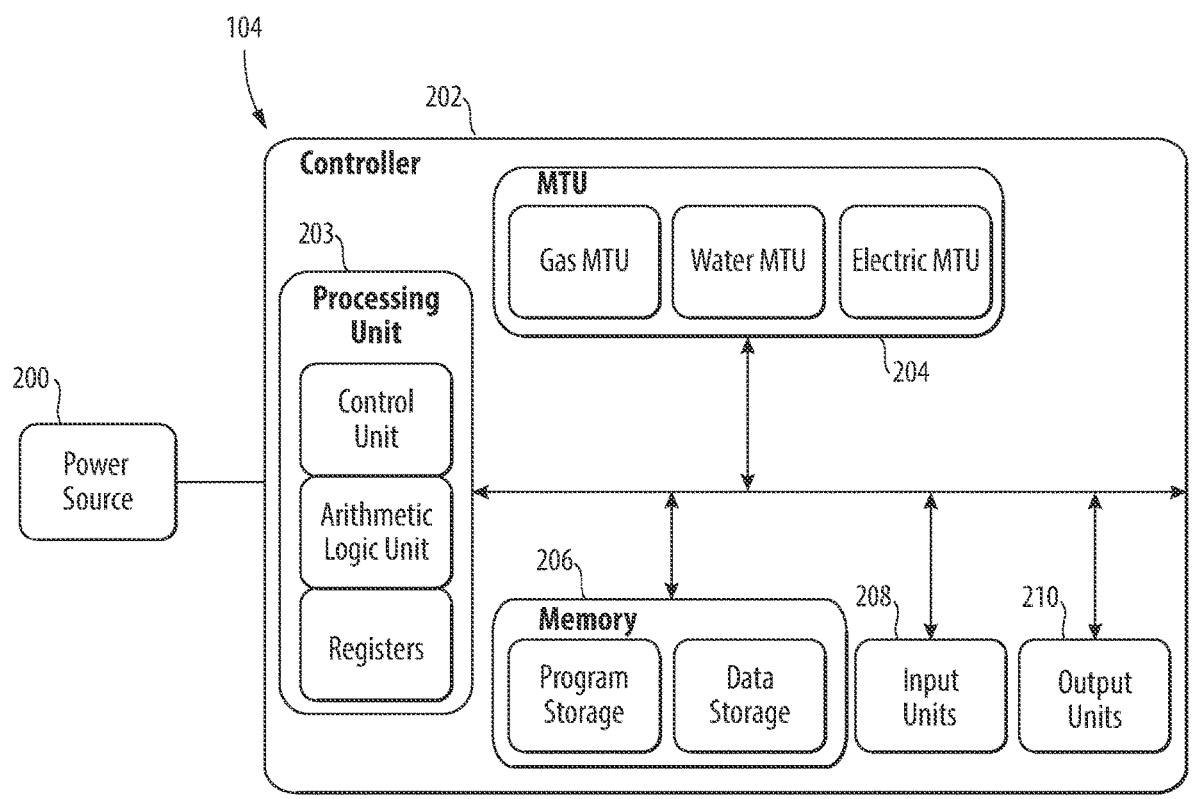
FIG. 2 illustrates an example of a controller of the solar power system of FIG. 1, according to some embodiments.

Data collection module 104 includes a plurality of electrical and electronic components that provide power, operational control, and/or protection to the components and modules within the data collection module 104 and/or the power system 100. For example, as shown in FIG. 2, the data collection module 104 includes, among other things, a controller 202 (e.g., an electronic processor, a microprocessor, a microcontroller, or another suitable programmable device), a meter transmission unit (MTU) 204, a memory 206, one or more input devices 208, and one or more output devices 210. The controller 202 may include an electronic processor 205 having a control unit, an arithmetic logic unit ("ALU"), and a plurality of registers (shown as a group of registers in FIG. 2). The controller 202, the MTU 204, the memory 206, the input devices 208, and the output devices 210, as well as various modules or circuits connected to the controller 202 are connected by one or more control and/or data buses. The data collection module 104, including its components, may receive power from the battery 200. The battery 200 may be, for example, a lead acid battery, a lithium-ion battery, or a battery having other known chemistries. In general operation, the solar panel 102 charges the battery 200 such that the data collection module 104 can function for a predetermined period of time.

The memory 206 is a non-transitory computer readable medium and includes, for example, a program storage area and a data storage area. The program storage area and the data storage area can include combinations of different types of memory, such as a ROM, a RAM (e.g., DRAM, SDRAM, etc.), EEPROM, flash memory, a hard disk, an SD card, or other suitable magnetic, optical, physical, or electronic memory devices. The controller 202 is connected to the memory 206 and executes software instructions that are capable of being stored in a RAM of the memory 206 (e.g., during execution), a ROM of the memory 206 (e.g., on a generally permanent basis), or another non-transitory computer readable medium such as another memory or a disc. Software included in the implementation of the system 100 and controller 202 can be stored in the memory 206 of the controller 202. The software includes, for example, firmware, one or more applications, program data, filters, rules, one or more program modules, and other executable instructions. The controller 202 is configured to retrieve from the memory 206 and execute, among other things, instructions related to the control processes and methods described herein. In other embodiments, the controller 202 includes additional, fewer, or different components.

The MTU 204 is configured to measure various meters connected to the system 100, such as water meters, gas meters, and electric meters. These meter measurements are stored in memory 206 and may be used for determining diagnostic information that indicates a state of the system 100. In some embodiments, the MTU 204 is configured to provide pricing information based on the meter measurements. In some embodiments, the MTU 204 may be configured to send a notification (i.e., a repair request, a status, an error, etc.) to the controller 202 indicating a malfunction. The malfunction may be based on the meter measurements.

Additionally, the meter measurements and diagnostic information may be transmitted to the server 108 (for example, via the antennas 106). The antennas 106 may transmit and receive data for the data collection module 104 at predetermined radio frequencies. In some embodiments, the predetermined radio frequencies are frequencies ranging from 450 MHz to 470 MHz. In some embodiments, the antennas 106 may transmit and receive data over a wide-area network (WAN). For example, the antennas 106 may be configured to communicate over cellular networks (3G, 4G, 5G, and the like), fiber-optic networks, Ethernet networks, Wi-Fi networks, and WiMAX networks. Additionally, information transmitted and received by the antennas 106 may be encrypted.

The data collection module 104 may additionally be configured to receive upcoming weather information via the antennas 106. For example, the data collection module 104 may be configured to receive, via the antennas 106, a location weather station. In some embodiments, the server 108 may automatically transmit weather information to the data collection unit module via the antennas 106.

Returning to FIG. 1, the server 108 may include an electronic processor, a memory, and a communication interface. The server 108 uses the communication interface to communicate over one or more communication lines or buses, wirelessly, or a combination thereof. In some embodiments, server 108 maintains a database storing information regarding a plurality of data collection modules. Additionally, the server 108 may receive requests from the user device 110 regarding the status of the data collection module 104 and the solar panel 102. The server 108 may send commands and alerts to the data collection module 104, or may forward notifications received by the data collection module 104 to the user device 110.

The user device 110 may allow for a user to transmit and receive data regarding the system 100. For example, the user device 110 may display data detailing a current status of the system 100, as provided by the data collection module 104. The user device 110 may display the amount of power being provided by the solar panel 102. The user device 110 may also display the amount of power stored in the battery 200. In some embodiments, the user may transmit data to the server 108 via the user device 110. For example, the user may input information such as a battery type, a solar panel type, an upcoming weather alert, a weather forecast, or the like.

Figure 3:
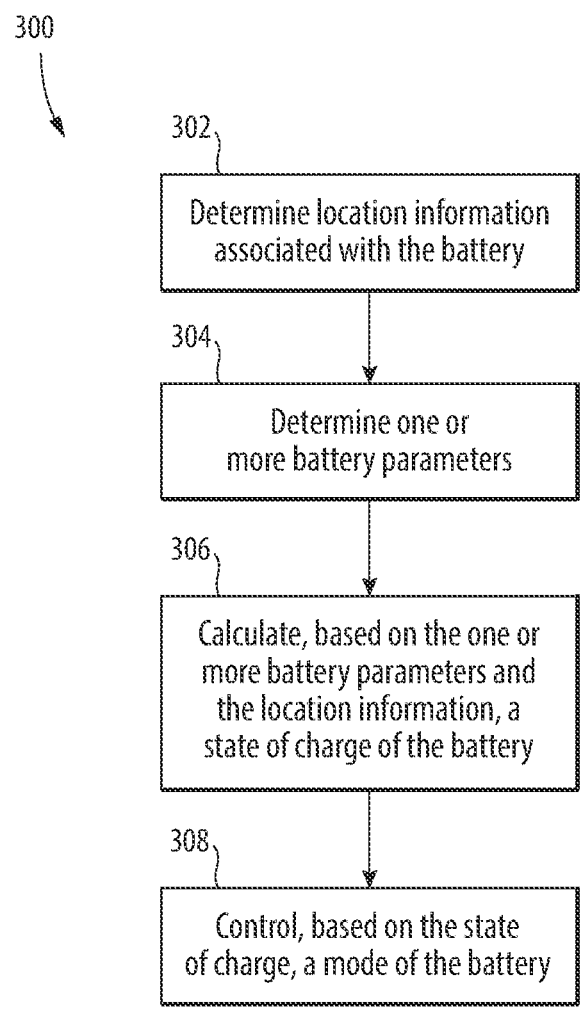
FIG. 3 illustrates a method performed by the controller of FIG. 2, according to some embodiments.

FIG. 3 illustrates a battery protection operation, or method, 300 according to some embodiments performed by the controller 202. For example, at block 302, the controller 202 determines location information associated with the battery. This location information may include, for example, a latitude, a longitude, an expected season, a time, a date, an ambient temperature, and/or a weather condition. The latitude and longitude may be received via a global positioning system (GPS) device associated with the system 100 and/or manually entered by a user. In some embodiments, the latitude and longitude of where the solar panel 102 is installed may be stored in the memory 206. Additionally, the location information may include where components of the system 100 were manufactured. In some embodiments, the ambient temperature is determined via a temperature sensor coupled to the controller 202, such as a thermistor or a thermocouple. In some embodiments, the temperatures sensor is part of the MTU 204.

In some embodiments, the controller 202 builds a climate model. For example, a machine learning algorithm may analyze historical weather data for the location to determine an expected weather. The controller 202 may use the climate model to determine future temperatures, humidity, and the like. The controller 202 may use the model to determine expected low power days in a given year. For example, days that are typically cold, foggy, and/or rainy result in less power generated by the solar panel 102. The climate model may develop a power loss probability based on the model, the power loss probability indicating days in which enough power is not stored to function. In some embodiments, the climate model provides a recommended battery size and a solar panel size. The recommended battery size and recommended solar panel size may be determined based on the climate of the location such that enough power can be generated and stored. In some embodiments, location information further includes design limitations, such as wind ratings, pole stress, roof ratings, temperature rating range, aesthetics of equipment, and/or cost restrictions. Design limitations may be used in conjunction with the climate model to determine recommended battery size, recommended solar panel size, recommended battery model, and/or recommended solar panel model.

In some embodiments, the controller 202 may utilize the climate model to determine a power loss probability for a given solar panel 102 and/or battery 200. For example, the model may determine, based on at least the climate of a location, how often the selected battery 200 and/or solar panel 102 may fail over an operational time period (e.g., 5 year battery, 15 year solar panel). The controller 202 may further utilize design limitations when determining the power loss probability. In some embodiments, the power loss probability changes as the battery 200 and solar panel 102 are used over time. For example, the power loss probability may be recalculated every month based on climate and weather experienced by the solar panel 102 and the battery 200. The power loss probability may be recalculated while using battery parameters, such as how often the battery 200 experiences a full charge cycle.

In some embodiments, the controller 202 may utilize the climate model to determine a seasonal period, such as the predicted beginning and duration of a season. For example, the length, variability, and/or severity of a winter period may be determined based on a latitude, cloud factors, and proximity to bodies or water, mountains, and predominant winds. In some embodiments, historical data may be used to determine a winter start and stop date for a given location. In some embodiments, the controller 202 may recognize two season periods, such as a winter period and a not-winter period.

In some embodiments, the controller 202 may utilize the climate model to determine a tilt angle of the solar panel 102. For example, a worst weather condition may be determined based on the climate model. The controller 202 may determine an optimal fixed angle of the solar panel 102 needed to maintain a minimum power to the load 112. In some embodiments, the controller 202 determines the tilt angle of the solar panel 102 for each season. For example, the controller 202 may determine an optimal fixed angle of the solar panel 102 during a winter season, wherein the optimal fixed angle is needed to maintain a minimum power to the load 112. The determined tilt angle may also be determined such that rain rinses dirt, bird residue, and other environmental factors from the solar panel 102. For example, solar panels 102 situated in generally dry environments may have a greater tilt angle, allowing for an easier cleaning process.

In some embodiments, the tilt angle is further determined based on the latitude of the location of the solar panel 102. For example, solar panels at a location with a latitude of 0° (the Equator) may have an optimal tilt angle of approximately 13°. Solar panels at a location with a latitude of 45° may have an optimal tilt angle of approximately 65°. Solar panels at a location with a latitude of 90° (north or south poles) may have an optimal tilt angle of approximately 90°.

The optimal tilt angle may increase non-linearly as the latitude value increases. In some embodiments, the optimal tilt angle is determined using the following equation:

$$TiltDeg = 90.37685 - \frac{76.55}{\left(1 + \frac{LatDeg}{39.711}\right)^{5.654882}}$$

where LatDeg is the latitude degree and TiltDeg is the optimal tilt angle.

At block 304, the controller 202 is configured to determine one or more battery parameters of the battery 200. The battery parameters may include, for example, a battery voltage, a maximum battery voltage, a battery current, a maximum battery current, a battery temperature, a battery cycle, a battery capacity, battery aging factors, and/or the like. The battery parameters may be transmitted from an electronic processor of the battery 200 to the controller 202. In some embodiments, the controller 202 may determine the battery parameters based on the power received from the battery 200. In some embodiments, the battery parameters are stored in the memory 206.

Figure 4:
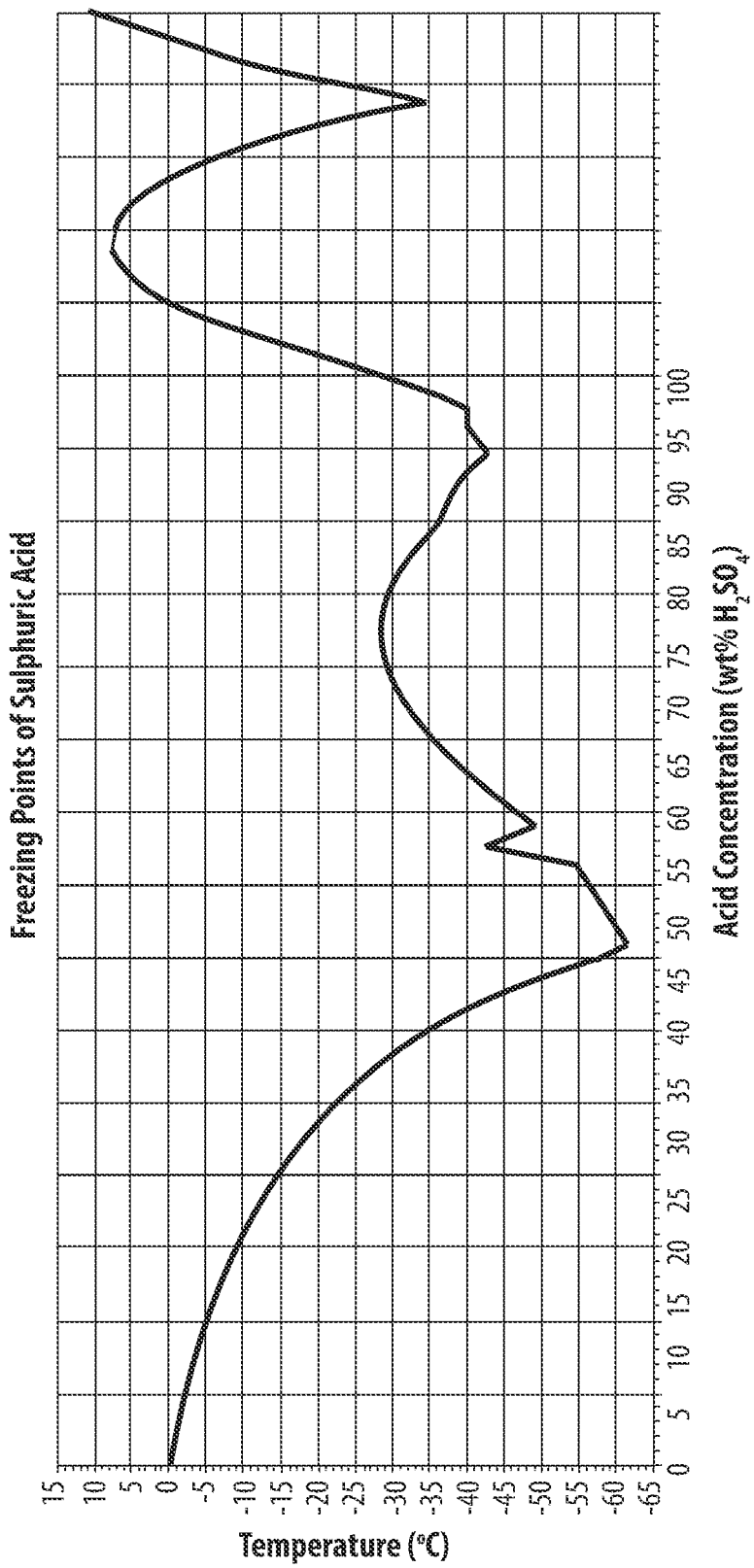
FIG. 4 illustrates a graph of the relationship between temperature and an acid concentration, according to some embodiments.

In some embodiments, determining the one or more battery parameters of the battery 200 includes determining a concentration of sulfuric acid within the battery 200. For example, lead acid batteries contain an electrolyte fluid consisting of sulfuric acid and distilled water. As the battery 200 discharges, the concentration of sulfuric acid decreases. In some embodiments, determining the one or more battery parameters of the battery 200 includes determining a freezing point of the battery 200. For example, the relationship between sulfuric acid concentration and the freezing point of the electrolyte fluid is shown in FIG. 4. This relationship may be used to determine the freezing point of the electrolyte fluid within the battery 200.

Returning to FIG. 3, at block 306, the controller 202 is configured to calculate, based on the one or more battery parameters and the location information, a state-of-charge of the battery. In some embodiments, the battery state-of-charge is determined by using a coulomb counting method. In the coulomb counting method, the current flowing from the battery 200 is integrated over time to determine the total sum of energy leaving the battery 200. In some embodiments, the battery state-of-charge is determined using a specific gravity method. In the specific gravity method, the battery discharge voltage is converted to an estimated state-of-charge using instantaneous battery temperature, voltage, and current measurements.

Figure 5:
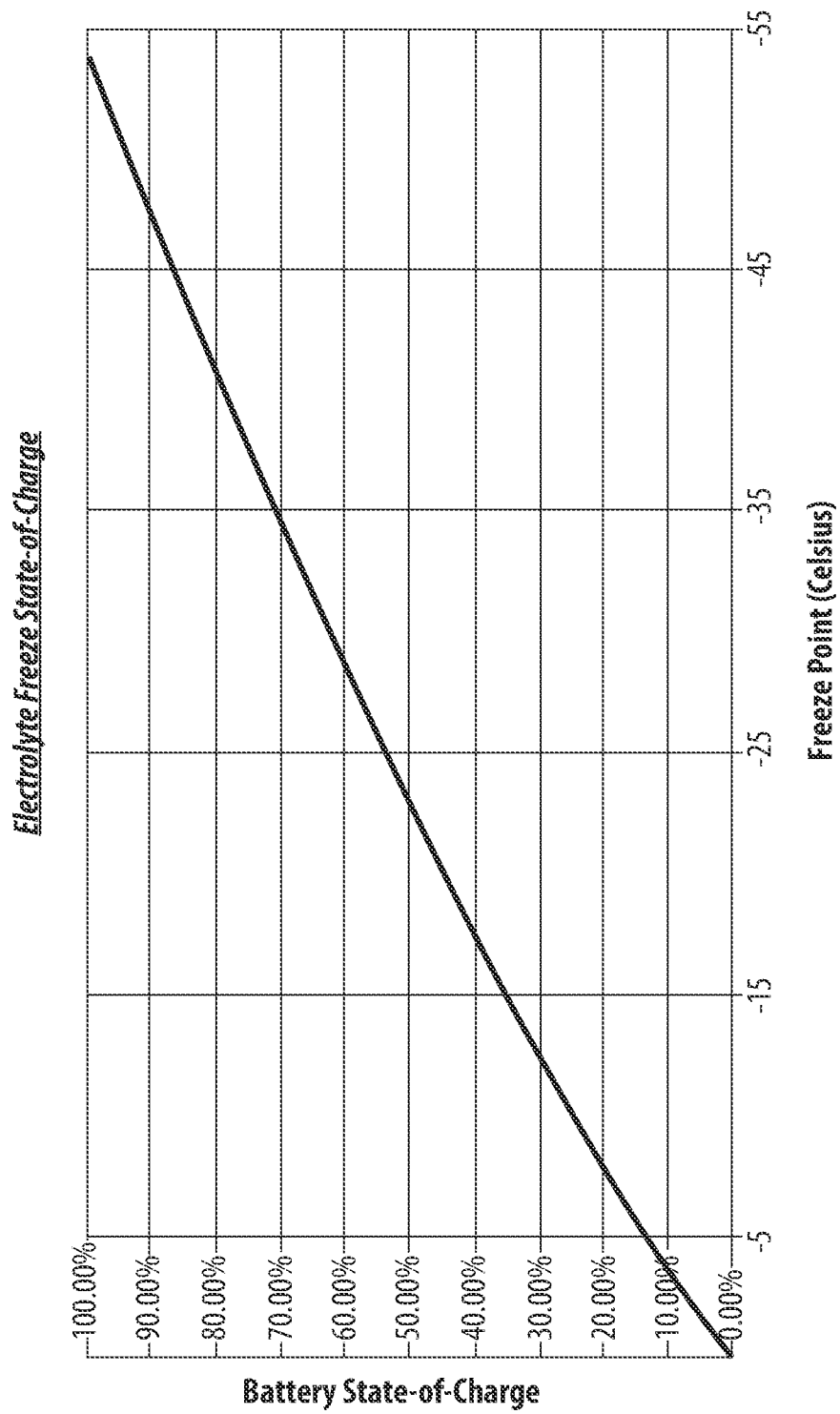
FIG. 5 illustrates a graph of the relationship between a battery state-of-charge and a freezing point, according to some embodiments.

In some embodiments, the battery state-of-charge is determined based on the battery freeze point. For example, if the concentration of sulfuric acid is determined to be less than 40%, an approximately linear relationship between battery state of charge and the battery freeze point exists, as shown in FIG. 5. The state-of-charge may be found using the following equation:

$$SoC = \frac{\sqrt{(T_C * 98.07848 + 5559)^2 - (5815.622 * T_C * 1000) - (T_C * 98.07848) - 5559}}{17446.98}$$

where SoC is the state-of-charge and $T_C$ is the freezing temperature of the battery 200 in Celsius.

In some embodiments, the battery state-of-charge is determined based on a battery temperature, a battery voltage, a battery current, and a battery series resistance (for example, in ohms). In such an embodiment, the following equation may be used:

Inputs:
  $T_{celcius}$=Temperature in Celsius
  $V_{bat}$=Battery Voltage
  $I_{bat}$=Battery Current (positive value indicates charging; negative value indicates discharging)
  BSR=Battery Series Resistance in ohms (default to 0.06 ohms for new battery)
  $R_{sys}$=LTC4015 resistor in ohms (Always set to 0.004 ohms)
  $B_{count}$=Number of batteries
  $B_{AHRS}$=Amp-Hour capacity of a single battery
Intermediate Calculations:

$OCV_{25C}$=Battery Open Circuit Voltage @ 25 Celcius $OCV_{25C}=V_{bat}+$
    $0.0741650164866545*2.71828182845905\textasciicircum(-$
    $0.0535910302272393*T_{bat})+$
    $(0.0000231911473560863*T_{bat}\textasciicircum 2-$
    $0.0044201531556652*T_{bat}+0.211524699929488)*(1-$
    $2.718282182845905\textasciicircum(-0.0311545574131909*(-$
    $V_{bat}*I_{bat})))*121.721441588921/(B_{count}*B_{AHRS})+((-$
    $V_{bat}*I_{bat}+LTCPowerBoardWatts)/V_{bat})*$
    $(BSR_{MeasuredDaily}+CableResistance_{Constant}+R_{sys})-$
    $1.47822446680515E-06*T_{bat}\textasciicircum 3+$
    $0.0000860627243786663*T_{bat}\textasciicircum 2-$
    $0.00195378950686534 \& T_{bat}+0.0606897311855272$ ActivityFactor=Battery Activity Factor
  ActivityFactor=$-17713.4182389649+$
    $5722.96922645935*OCV_{25C}-$
    $693.396695713713*OCV_{25C}\textasciicircum 2+$
    $37.338752522479*OCV_{25C}\textasciicircum 3-$
    $0.753940315715226*OCV_{25C}\textasciicircum 4$ ActivityBasis=Battery Basis for State-of-Charge
  ActivityBasis=IF($OCV_{25C}$>13.2,1,IF($OCV_{25C}$<11.48,0, (LOG 10(EXP((2.041-$OCV_{25C}$/6)/ 0.0128463044000366))/(-1.59868110391458)+3.15)/ 6.3))

Output:
  SOC=Battery State-Of-Charge
  SOC=ActivityBasis*ActivityFactor

In some embodiments, the controller 202 is configured to determine a seasonal threshold of the battery 200. The seasonal threshold may be, for example, the minimal amount of power needed to power the load 112 based on the forecasted weather for the day (and/or any other time period). In some embodiments, the capacity at which the battery 200 may freeze for the current temperature is the freezing capacity. In some embodiments, the seasonal threshold is determined based on the climate model, as previously described. For example, the battery 200 may maintain enough reserve capacity to remain above the freezing capacity while also providing a minimum power to the load 112. The battery 200 may also have the capacity to supply power to load 112 for a predetermined weather event and/or low temperature, as previously detailed. This reserve capacity may be used to determine a seasonal state-of-charge threshold by multiplying the length of the weather event or low temperature by 24 hours/day and by further multiplying by battery-load Watts. For example, for a weather event with a predicted duration of five (5) days, a battery load of 4 Watts, and a 50 Ahr 12V battery, the state-of-charge reserve capacity would be (5*24*4/(50*12)). In some embodiments, the battery 200 may be in a low power mode. For example, in a low power mode, the state-of-charge capacity may lower to 10%(5*24*4/(50*12)).

In some embodiments, the controller 202 may determine a seasonal state-of-charge threshold by estimating the lowest probabilistic temperature for the battery 200 based on a battery life reliability. In some embodiments, the controller 202 may determine a seasonal state-of-charge threshold by identifying the freeze point state-of-charge for a given temperature by using the freeze point state-of-charge curve equation, as previously explained. In some embodiments, the controller 202 may determine a seasonal state-of-charge threshold by calculating the reserve state-of-charge and multiplying the event length by the battery load, and dividing the result by the battery Watt-hour rating. In some embodiments, the controller 202 may determine a seasonal state-of-charge threshold by adding the freeze state-of-charge with the reserve state-of-charge.

At block 306, the controller 202 is configured to control, based on the state-of-charge, a mode of the battery. The mode of the battery 200 may be, for example, a low power mode, a full power mode, a decreased power mode, or the like. While in low power mode, the battery 200 may provide a minimum amount of power such that they system 100 provides a minimum functionality of the load 112.

In some embodiments, transitioning from a low power mode to a full power mode, or transitioning from a full power mode to a low power mode, uses a rolling averaging process based on the time between measurements. For example, the following equation may be used:

StateOf Charge average=0.3614*StateOf Chargemeasurement+(1−0.3617)*StateOf Chargeaverage Wherein StateOfChargeaverage is the average state-of-charge, and the StateOfChargemeasurement is the measured state-of-charge. In some embodiments, the controller 202 may utilize hysteresis provisions when determining to transition from full power mode to lower power mode. For example, the controller 202 may utilize historical state-of-charge data stored in the memory 206 to determine the average state-of-charge.

In some embodiments, the minimal functionality of the load 112 includes a schedule that must persist while the battery discharge state-of-charge falls below the seasonal threshold for the given period of time. For example, if weather is predicted to be snowing for three days, the minimal functionality includes a schedule details when the battery 200 should discharge, and how much discharge should occur, over the three day period such that the load 112 receives power and the battery 200 does not freeze.

In some embodiments, the controller 202 is further configured to provide a status report to the server 108. The status report may include, for example, the current state-of-charge of the battery 200, the average state-of-charge of the battery 200, the current mode of the battery 200, a notification that the solar panel 102 is covered in snow, a notification indicating a failure of the battery 200, and/or the like. In some embodiments, the controller 202 provides a status report based on a predetermined schedule. In some embodiments, the controller 202 provides a status report each time the mode of the battery 200 changes.

Figure 6:
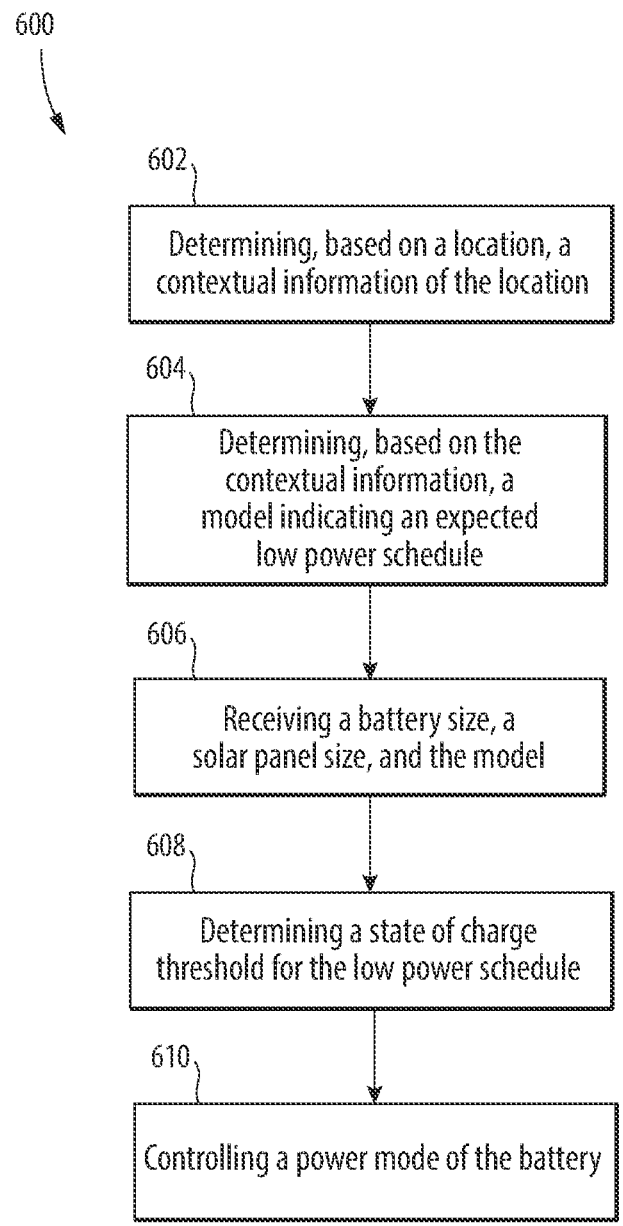
FIG. 6 is a flowchart illustrating an operation performed by the controller of FIG. 2, according to some embodiments.

FIG. 6 illustrates an alternative battery protection operation, or method, 600 according to some embodiments, performed by the controller 202. At block 602, the controller 202 determines, based on a location, a contextual information of the location. This contextual information may be, for example, the location information previously described. At block 604, the controller 202 may determine, based on the contextual information, a model indicating an expected low power schedule. This model may be, for example, similar to the climate model described previously in method 300. The model may indicate day(s) where power provided by the solar panel 102 is expected to be below a threshold. At block 606, the controller 202 receives a battery size, a solar panel size, and/or the model. At block 608, the controller 202 may determine a state-of-charge threshold for the low power schedule. For example, the controller 202 may account for the battery size, the solar panel size, the model, and/or the low power schedule to determine a state-of-charge threshold. The state-of-charge threshold may indicate a minimum state-of-charge required by the battery 200 to both provide minimal functionality to the load 112 and remain above the freezing point of the battery 200 for the current ambient temperature. At block 610, the controller 202 may control a power mode of the battery 200.

Figure 7:
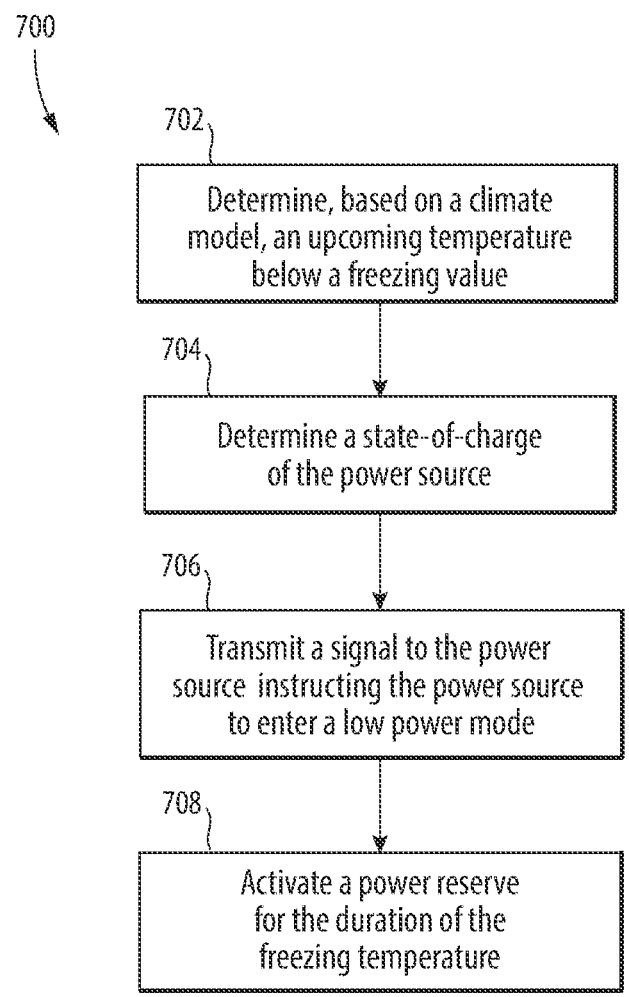
FIG. 7 is a flowchart illustrating an operation performed by the controller of FIG. 2, according to some embodiments.

FIG. 7 illustrates an operation, or method, 700 performed by the controller 202 according to some embodiments. At block 702, the controller 202 determines, based on a climate model, an upcoming temperature below a freezing value. For example, the controller 202 may use a climate model, as previously described, to determine that the upcoming night will feature a temperature of −2° C. At block 704, the controller 202 determines the state-of-charge of a power source (for example, the battery 200). At block 706, the controller 202 transmits a signal to the power source instructing the power source to enter a low power mode. At block 708, the controller 202 activates a power reserve for the duration of the freezing temperature. For example, the system 100 may include a power reserve charged by the solar panel 102. Once the power reserve is fully charge, the controller 202 may shut the power reserve off from the system 100. In the case of the battery 200 entering a low power mode, the controller 202 may activate the power reserve to supply power to the load 112, allowing the battery 200 to remain at a state-of-charge above the freezing state-of-charge.

Figure 8:
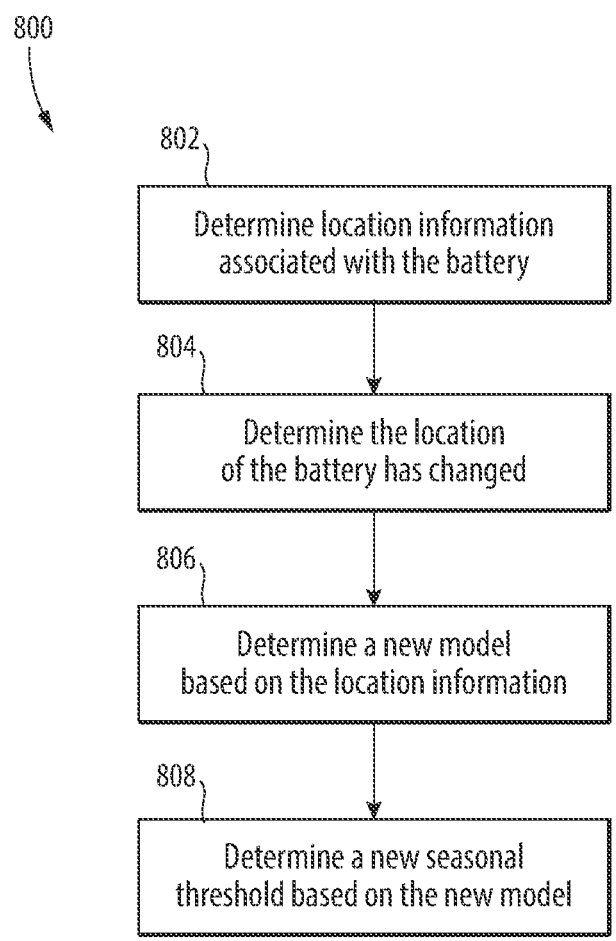
FIG. 8 is a flowchart illustrating an operation performed by a server of FIG. 1, according to some embodiments.

FIG. 8 illustrates an operation, or method, 800 according to some embodiments performed by the controller 202 for determining a new state-of-charge threshold. For example, at block 802, the controller 202 determines location information associated with the battery 200. This location information may be similar to the location information previous discussed in method 300. At block 804, the controller 202 determines the location of the battery 200 has changed. For example, the longitude and latitude of the battery 200 stored in the memory 206 may be compared to the longitude and latitude received by a GPS device associated with the system 100. If the longitude and latitude of the battery 200 stored in the memory 206 (the previous location) does not match with the longitude and latitude received by the GPS device (the current location), the controller 202 determines the location of the battery 200 has changed.

At block 806, the controller 202 determines a new model based on the location information. For example, the controller 202 uses new climate information, historical information, expected weather, and the like to develop a new model for the new location. At block 808, the controller 202 determines a new seasonal threshold based on the new model. The controller 202 may be further configured to control the mode of the battery 200 based on the new seasonal threshold.

Figure 9:
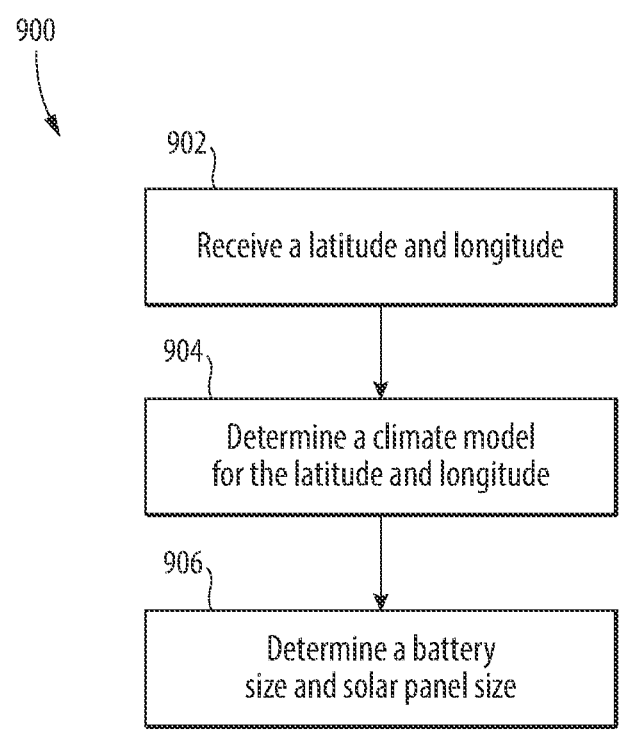
FIG. 9 is a flowchart illustrating an operation performed by a server of FIG. 1, according to some embodiments.

The disclosed methods are not limited to being performed by the controller 202 and may be performed by other components of the system 100, such as, for example, the server 108. FIG. 9 illustrates an operation, or method, 900 according to some embodiments, which may be performed by the server 108. At block 902, the server 108 receives a latitude and a longitude. The server 108 may receive this information from the user device 110, the GPS device, or the like. At block 904, the server 108 determines a climate model for the latitude and longitude, as discussed previously. At block 906, the server 108 determines a battery size and solar panel size based on the climate model. For example, the server 108 may determine the battery size and solar panel size that results in the optimal power required for the load 112 while accounting for possible low-power days.

Figure 10:
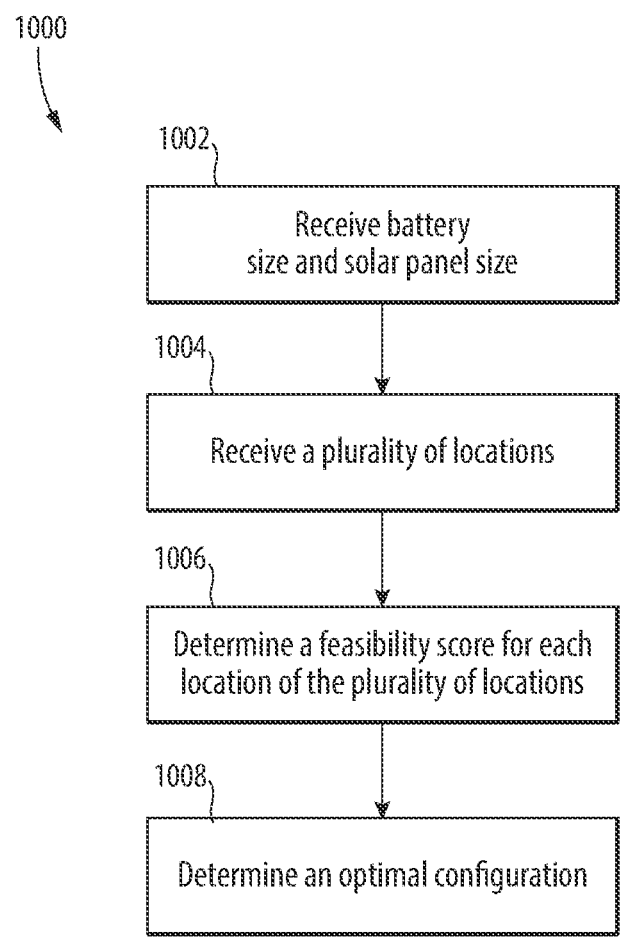
FIG. 10 is a flowchart illustrating an operation performed by a server of FIG. 1, according to some embodiments.

FIG. 10 illustrates an additional operation, or method, 1000 according to some embodiments, which may be performed by the server 108. At block 1002, the server 108 receives a battery size and/or a solar panel size. At block 1004, the server 108 receives one or more locations. For example, the server 108 may receive a list of latitude and longitude pairs, each latitude and longitude pair corresponding to a location. At block 1006, the server 108 determines a feasibility score for each location of the one or more locations. For example, the server 108 may give each location a feasibility score from a scale of 0 to 100, detailing whether or not the given battery size and solar panel size are feasible for that location. For example, a solar panel with a 100 watt output and a battery having a 30 AHr rating may have a feasibility score of 25 in a location with a longitude of 79.4° W and a latitude of 43.7° N. In some embodiments, the feasibility score may be a letter scale (F-A), a percentage score, or a simple binary score (thumbs up or thumbs down). At step 1008, the server 108 determines an optimal configuration for each location. For example, if the feasibility score for a given location is low, the server 108 may provide a battery size and solar panel size that will increase the feasibility score. In some embodiments, the server 108 further accounts for a desired cost when determining the optimal configuration.

Embodiments provide, among other things, systems and methods for monitoring and/or protecting state-of-charge of one or more batteries. Various features and advantages of the application are set forth in the following claims.

What is claimed is:

1. A method for protecting a state-of-charge of a battery, the method comprising:
   determining, via a controller, location information associated with the battery, wherein the location information includes an ambient temperature;
   determining, via the controller, a temperature of the battery;
   calculating, based on the temperature of the battery and the location information, a state of charge of the battery; and
   controlling, via the controller and based on the state of charge, a mode of the battery.

2. The method of claim 1, further including reporting, via the controller, a status of the battery.

3. The method of claim 2, wherein the status further includes at least one selected from a group consisting of a change in state of charge, a power mode, a configuration change, and a warning notification.

4. The method of claim 1, wherein the battery is a lead acid battery.

5. The method of claim 1, wherein the location information further includes at least one selected from a group consisting of a latitude, a longitude, an expected season, a time, a date, and a weather condition.

6. The method of claim 1, further comprising determining, via the controller, one or more battery parameters, wherein the battery parameters include at least one selected from a group consisting of a current battery voltage, a maximum battery voltage, a battery current, a maximum battery current, a temperature of the battery, and a maximum temperature of the battery.

7. The method of claim 1, wherein the mode of the battery is one selected from a group consisting of a low power mode and a full power mode.

8. The method of claim 1, the method further comprising:
   determining the location of the battery has changed; and
   updating the location information based on the new location.

9. A method for protecting a state-of-charge of a battery, the method comprising:
   determining, via an electronic processor and based on a location, a contextual information of the location;
   determining, via the electronic processor and based on the contextual information, a model indicating an expected low power schedule;
   receiving, via the electronic processor, a battery size, a solar panel size, and the model;
   determining, via the electronic processor, a state of charge threshold for the low power schedule; and
   controlling, via the electronic processor, a power mode of the battery.

10. The method of claim 9, wherein the contextual information is a local weather forecasting data.

11. The method of claim 9, further comprising determining, based on the location and the solar panel size, an optimal tilt angle of the solar panel.

12. The method of claim 9, further comprising entering a low power state based on the low power schedule.

13. The method of claim 9, further comprising determining a power loss probability based on the model.

14. The method of claim 13, further comprising entering a low power state when the power loss probability passes a threshold.

15. A power system comprising:
   a solar panel;
   a power source configured to receive energy from the solar panel; and
   an electronic processor coupled to the power source, the electronic processor configured to:
      determine, based on a climate model, an upcoming temperature below a freezing value;
      determine a state of charge of the power source;
      transmit a signal to the power source instructing the power source to enter a low power mode; and
      activate a power reserve for the duration of the freezing temperature.

16. The system of claim 15, wherein the climate model includes determining a winter start date based on historical temperature data.

17. The system of claim 15, wherein the electronic processor is further configured to determine a concentration of sulfuric acid of the power source.

18. The system of claim 15, wherein the low power mode maintains the power source at a capacity above a freezing capacity.

19. The system of claim 15, wherein the electronic processor is further configured to determine at least one from a group consisting of a power source voltage, a power source current, and a power source temperature.

20. The system of claim 15, wherein the electronic processor is further configured to transition the power source from a normal power mode to the low power mode.

21. The system of claim 20, wherein the electronic processor is further configured to transition the power source from the low power mode to the normal power mode; and
provide hysteresis provisions when transitioning from the lower power mode to the normal power mode.

* * * * *